United States Patent [19]

McAdams

[11] Patent Number: 5,303,180
[45] Date of Patent: Apr. 12, 1994

[54] PIN PROGRAMMABLE DRAM THAT ALLOWS CUSTOMER TO PROGRAM OPTION DESIRED

[75] Inventor: Hugh P. McAdams, McKinney, Tex.

[73] Assignee: Texas Instruments Incorporated, Dallas, Tex.

[21] Appl. No.: 752,111

[22] Filed: Aug. 29, 1991

[51] Int. Cl.$^5$ ............................................... G11C 5/06
[52] U.S. Cl. ........................................ 365/63; 365/51
[58] Field of Search ................ 365/51, 63, 189.01, 365/96

[56] References Cited

U.S. PATENT DOCUMENTS

| | | | |
|---|---|---|---|
| 4,789,966 | 12/1988 | Ozaki | 365/96 |
| 4,990,800 | 2/1991 | Lee | 307/465 |
| 5,057,712 | 10/1991 | Trinh et al. | 307/465 |
| 5,161,124 | 11/1992 | Love | 365/63 X |

Primary Examiner—Joseph A. Popek
Attorney, Agent, or Firm—Richard B. Havill; Ronald O. Neerings; Richard L. Donaldson

[57] ABSTRACT

The described embodiments of the present invention provide a circuit and method for programming the organization and mode options of an integrated circuit. The embodiment described provides this function for a dynamic random access memory but is applicable to any integrated circuit. The integrated circuit includes programming lead pins, connected to respective programming bond pads, which are connected to an external first reference potential or to an external second reference potential. Circuitry on the integrated circuit provides logical signals on the integrated circuit which select the operational organization and mode of the integrated circuit.

12 Claims, 3 Drawing Sheets

1MX4

| | |
|---|---|
| DQ1 | VSS |
| DQ2 | DQ4 |
| /WE | DQ3 |
| /RAS | /CAS |
| Q9 | /OE |
| | |
| A0 | A8 |
| A1 | A7 |
| A2 | A6 |
| A3 | A5 |
| VCC | A4 |

| | |
|---|---|
| DQ1 | VSS |
| DQ2 | DQ4 |
| /WE | DQ3 |
| /RAS | /CAS |
| A9 | /OE |
| OP2 | OP3 |
| OP1 | NC |
| A0 | A8 |
| A1 | A7 |
| A2 | A6 |
| A3 | A5 |
| VCC | A4 |

| | |
|---|---|
| D | VSS |
| /WE | Q |
| /RAS | /CAS |
| NC | NC |
| A10 | A9 |
| | |
| A0 | A8 |
| A1 | A7 |
| A2 | A6 |
| A3 | A5 |
| VCC | A4 |

| | |
|---|---|
| D | VSS |
| /WE | Q |
| /RAS | /CAS |
| NC | NC |
| A10 | A9 |
| OP2 | OP3 |
| OP1 | NC |
| A0 | A8 |
| A1 | A7 |
| A2 | A6 |
| A3 | A5 |
| VCC | A4 |

*Fig. 3b*

PIN PROGRAMMABLE DRAM THAT ALLOWS CUSTOMER TO PROGRAM OPTION DESIRED

FIELD OF THE INVENTION

This invention relates to a programmable DRAM that allows the customer to program the option desired. In particular, this invention relates to a pin programmable 4M DRAM that allows the customer to program the option he wants at the board level.

BACKGROUND OF THE INVENTION

Dynamic Random Access Memories (DRAMs) since the 64K generation have offered options to the basic memory function provided by a simple x1 organization. The 64K DRAM offered a 64Kx1 organization as well as a 16Kx4 organization at the same memory density. However, these two offerings were usually totally separate designs, mask sets and they required separate qualifications by customers. The 256K generation for the most part paralleled the 64K regarding having separate designs for the 256Kx1 and 64Kx4 parts. With the 256K additional options beside organization were offered. The 256K generation also offered nibble mode on the x1 along with the standard page mode version.

With the advent of the 1M, several manufacturers sourced all their device options from one basic mask set. The device options included choice of organization and choice of function, such as page, nibble or static column modes. The desired option is selected during wafer fabrication at metal patterning or in the assembly operation at wire bond. This approach simplifies the inventory of multiple device types for both manufacturer and customer.

In bond programming, the option desired is chosen by selectively bonding the programming pads to Vdd or Vss or leaving them open. If a pad is left un-bonded, the pad is taken to a default potential on chip. The necessary reconfiguration within the chip for the desired mode of operation is accomplished through setting of logic gates and use of CMOS transfer devices. Selection at this stage of manufacturing puts the decision closer to the point of customer delivery and allows the marketing and manufacturing organizations greater flexibility in servicing the customer's needs.

The use of bond programming leads to an interesting possibility—letting the customer himself determine the option he wants at the point of use, his board. If a way can be found for him to do so, without increasing the cost of the device or his system costs, then there appear to be advantages for both the manufacturer and the user. Having a single device from which to source all device options solves his inventory problems for multiple device types while freeing his designers to choose the best device for the application. In both cases it simplifies the question of product mix from "how many of which kind?" to simply "how many?"

SUMMARY OF THE INVENTION

The described embodiments of the present invention provide a circuit and method for programming the mode options of an integrated circuit at the board level. The embodiments described provide this function for dynamic random access memories (DRAMs) but are applicable to any integrated circuit. In a preferred embodiment, a 4M DRAM is presented which allows the customer to program the 4M DRAM at the board level. The device options include choice of organization, such as 4Mx1 and 1Mx4 formats, and choice of function, such as page, nibble, SCD and serial. Having a single device from which to source all device options solves a customer's inventory problems for multiple device types, while freeing his designers to choose the best device for the application.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a pinout of a 1Mx4 DRAM utilizing a 26 pin SOJ package.

FIG. 2 is a pinout of a 4Mx1 DRAM utilizing a 26 pin SOJ package.

FIGS. 3A and 3B are a pinout of a 4M DRAM utilizing a 26 pin SOJ package, showing pin definitions for x1/x4 options, according to the invention.

DETAILED DESCRIPTION OF THE INVENTION

The described embodiment of the present invention is a dynamic random access memory using lead pins of a package pinout to provide programmability with respect to the mode of operation. The choice of a dynamic random access memory is provided for exemplary purposes only and is not to be construed as limiting the invention to use in DRAMS, random access memories or memories at all. The present invention is equally applicable to any integrated circuit to provide mode programmability at the point of use.

FIGS. 1 and 2 show package pinouts of existing 4M DRAMs without mode programmability. The 4M DRAMs utilize 26 pin SOJ packages. FIG. 3A and 3B disclose a package pinout of a 4M DRAM with options for organization and mode programmability according to one embodiment of the invention. The 4M DRAM, according to this embodiment of the invention, uses a 26 pin SOJ package. FIGS. 3A and 3B disclose pin definitions for the x1/x4 options. Three lead pins are required to provide programmability with respect to the organization and mode of operation of the dynamic random access memory. Note the utilization of lead pins 6, 8 and 21.

Figure 4:
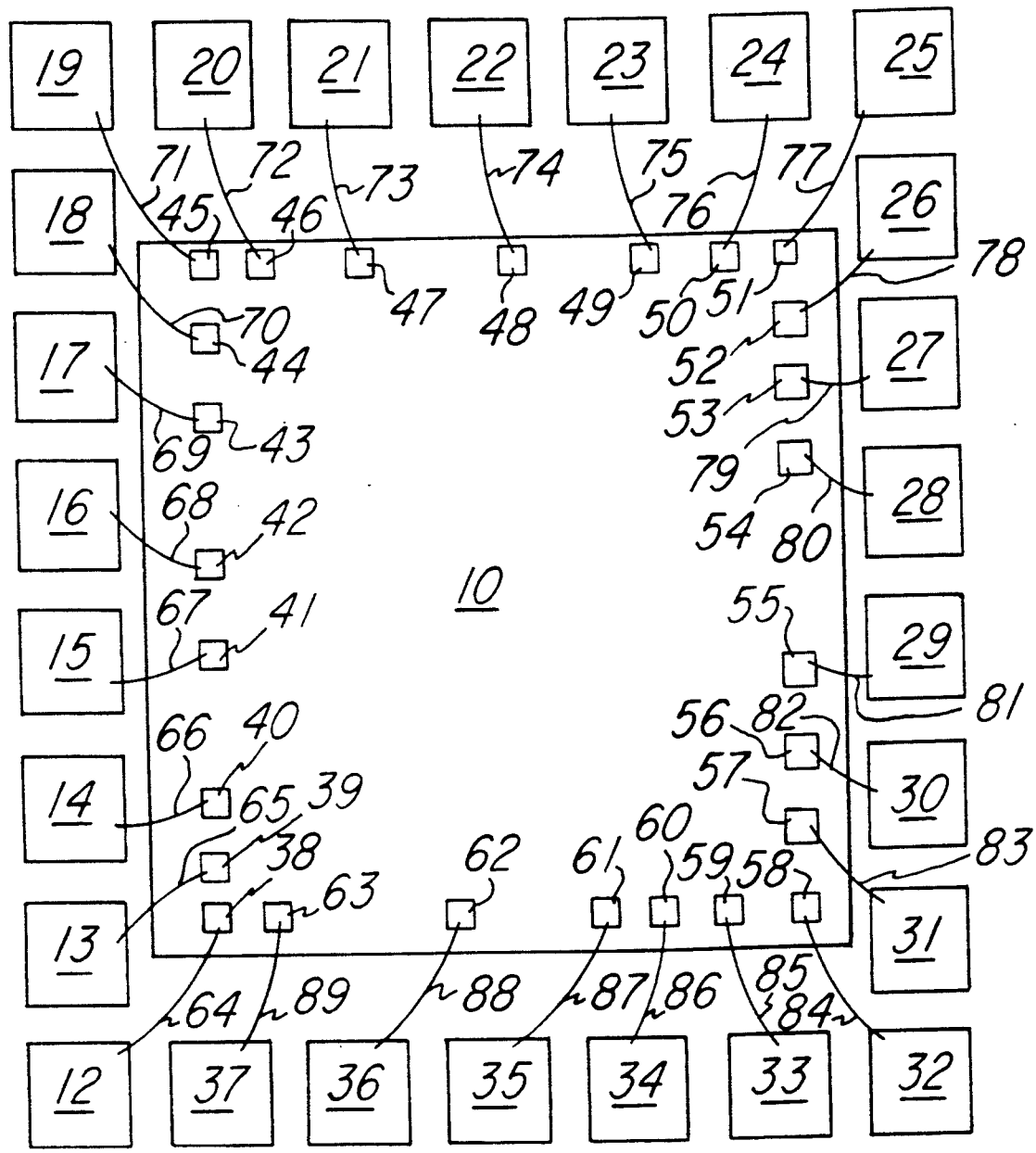
FIG. 4 is a schematic diagram showing an integrated circuit situated in a lead frame with its bond pads schematically connected to the lead pads of the lead frame.

FIG. 4 is a schematic diagram showing the positioning of an integrated circuit 10 between the lead frame lead pads 12-37. These lead pads are connected to bond pads 38-60 and programming bond pads 61-63 by bonding wires 64 through 89. The signals provided to bond pads 38 through 60 are the normal signals utilized in an integrated circuit of the type of integrated circuit 10. In this example, integrated circuit 10 is a dynamic random access memory and signals such as address signals, data output signals, row address strobe and column address strobe are provided via these bond pads. Bond pads 61-63 are connected to lead pads 35-37, respectively. Lead pads 35-37 extend into lead pins (not shown). Bond pads 61-63 are selectively connected to an external reference voltage Vcc or Vss depending upon the selected programmable option configuration of the integrated circuit thus provided.

After mounting the integrated circuit onto the lead frame and placing the bond wires, the entire assembly is encapsulated in plastic (not shown) by injection molding excepting the ends of the lead frame, which form the lead pins for connection to the circuit board (not shown). In a preferred embodiment, these lead pins form two in-line rows. This is known in the industry as a "dual in-line package" and is a standard package. For this embodiment of the invention, a 26 pin SOJ package is utilized. Of course, many other types of packages may be suitably used such as ceramic packaging or surface mounting techniques.

Figure 5:
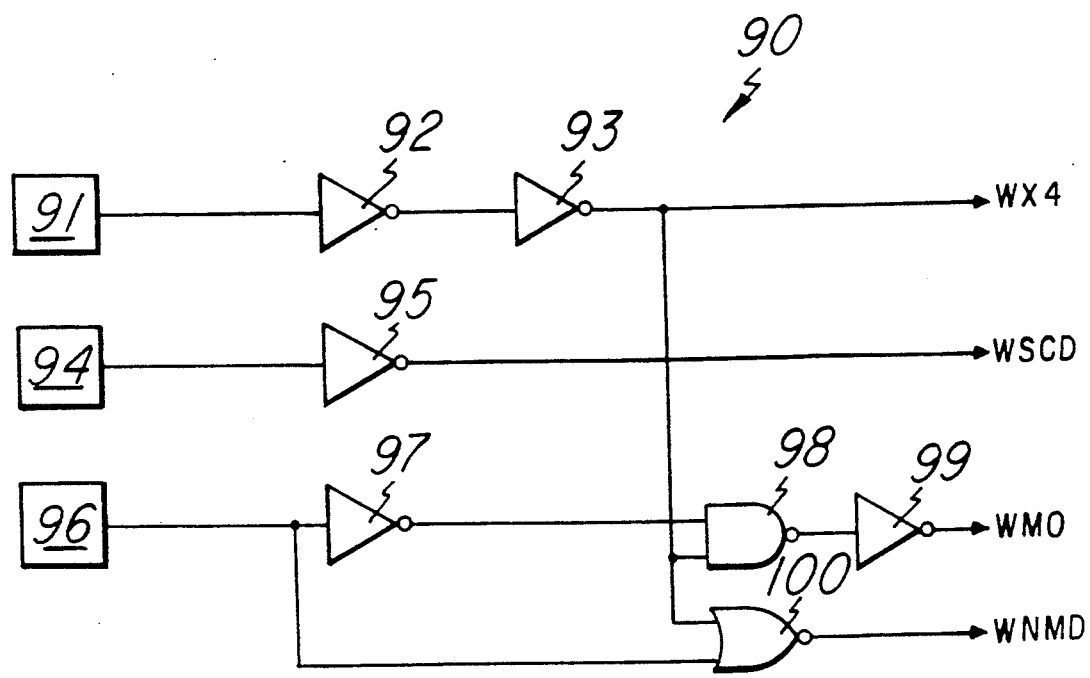
FIG. 5 is a schematic diagram showing the programming mode circuitry on the integrated circuit.

FIG. 5 is a schematic diagram showing organization and mode programming circuitry 90. Bond pad 91 is connected to the input of an inverter 92. The output of inverter 92 is connected to the input of an inverter 93. The output of inverter 93 is coupled to circuitry (not shown) that sets the DRAM to either a x1 or x4 organization. A low voltage signal on bond pad 91, such as Vss, is inverted to a high voltage signal by inverter 92 and is again inverted to a low signal by inverter 93. A low voltage signal on the output of inverter 93 provides the control signal that sets the DRAM to the x1 option. Contrariwise, a high voltage signal on bond pad 91, such as Vcc, is inverted to a low voltage signal by inverter 92 and is again inverted to a high signal by inverter 93. A high voltage signal on the output of inverter 93 provides the control signal that sets the DRAM to the x4 organization.

Bond pad 94 is connected to the input of an inverter 95. The output of inverter 95 is coupled to circuitry (not shown) that sets the DRAM to either the page/nibble mode or the SCD (static column decode) mode. A low voltage signal on bond pad 94 is inverted to a high voltage signal by inverter 95. A high voltage signal on the output of inverter 95 provides the control signal that sets the DRAM to the static column decode mode. Contrariwise, a high voltage signal on bond pad 94 is inverted to a low voltage signal by inverter 95. A low voltage signal on the output of inverter 95 provides the control signal that sets the DRAM to the page/nibble mode.

Bond pad 96 is connected to the input of an inverter 97. The output of inverter 97 is connected to an input of NAND gate 98. The output of NAND gate 98 is connected to the input of an inverter 99. The output of inverter 99 is coupled to circuitry (not shown) that sets the write mask option (WMO). The input of inverter 97 is also connected to an input of a NOR gate 100. The output of NOR gate 100 is coupled to circuitry (not shown) that sets the nibble mode option (WNMO); A second input of NAND gate 98 and a second gate of NOR gate 100 are together coupled to the output of inverter 93. A low voltage signal on bond pad 96 presents a low voltage signal on the input of inverter 97 and on an input of NOR gate 100. If the voltage signal on the output of inverter 93, which is connected to the second input of NAND gate 98 and NOR gate 100, is low, the output of NAND gate 98 will be a logic high signal which is then inverted to a logic low signal by inverter 99 and output to the write mask option circuitry. Concurrently, a low voltage signal on the second input of NOR gate 100 results in a high logic signal being output to the nibble mode selection (option) circuitry. If, on the other hand, the voltage signal on the output of inverter 93 is high, the output of NAND gate 98 will be a logic low signal which is then inverted to a logic high signal by inverter 99. Concurrently, a high voltage signal on the second input of NOR gate 100 results in a low logic signal being output to the nibble mode selection (option) circuitry.

A high voltage signal on bond pad 96 presents a high voltage signal on the input of inverter 97 and on the input of NOR gate 100. Inverter 97 inverts the high voltage signal to a low voltage signal. The low voltage signal on the output of inverter 97 is applied to an input of NAND gate 98. If the voltage signal on the output of inverter 93, which is connected to the second inputs of NAND gate 98 and NOR gate 100, is low, the output of NAND gate 98 will be a logic high signal which is then inverted to a logic low signal by inverter 99 and output to the write mask option circuitry. Concurrently, a low voltage signal on the second input of NOR gate 100 results in a low voltage logic signal being output to the nibble mode option circuitry. If, on the other hand, the voltage signal on the output of inverter 93 is high, the output of NAND gate 98 will be a logic low signal which is then inverted to a logic high signal by inverter 99 and output to the write mask option circuitry. Concurrently, a high voltage signal on the second input of NOR gate 100 results in a low logic signal being output to the write nibble mode circuitry.

The programming lead pins receive external reference voltage signals OP1–OP3, respectively. Possible organization and mode programming options are listed below in Table 1.

TABLE 1

| | | | OPTION | |
|---|---|---|---|---|
| OP1 | OP2 | OP3 | ORG. | FUNCTION (MODE) |
| Vss | Vss | Vcc | x4 | SCD with Write Per Bit |
| Vss | Vcc | Vss | x1 | Nibble Mode |
| Vss | Vcc | Vcc | x4 | Enhanced Page Mode with Write Per Bit |
| Vcc | Vss | Vss | x1 | SCD |
| Vcc | Vss | Vcc | x4 | SCD |
| Vcc | Vcc | Vss | x1 | Enhanced Page Mode |
| Vcc | Vcc | Vcc | x4 | Enhanced Page Mode |

Table 1 is self-explanatory. For example, if a ×4 DRAM with Enhanced Page Mode is desired, OP1–OP3 (pins 8, 6 and 21) are all connected to Vcc. Thus the circuitry allows external sourcing of all device options from a single device.

While this invention has been described with reference to an illustrative embodiment, this description is not intended to be construed in a limiting sense. Various modifications to the illustrative embodiment, as well as other embodiments of the invention will be apparent to persons skilled in the art upon reference to this description. It is therefore contemplated that the appended claims will cover any such modification or embodiments as fall within the true scope of the invention.

What is claimed:

1. An electronic device having selectable programmable features comprising:

an integrated circuit carrying plural programming bond pads, said programming bond pads each being connected to a respective programming lead pin;

said programming lead pins each being selectively connectable either to an external first voltage Vcc source or to an external second voltage Vss sources; and programming option circuitry connected to said plural programming bond pads and sensing the voltage on each of said programming lead pins, said option circuitry producing at least one output signal of one state in response to a respective programming lead pin being coupled to said external first voltage Vcc source and of another state in response to said respective programming lead pin being coupled to said external second voltage Vss source.

2. The electronic device of claim 1 in which said electronic device is a dynamic random access memory including first, second and third programming bond pads.

3. The electronic device of claim 2 wherein the first and second programming bond pads are connected to the external second voltage Vss source and the third programming bond pad is connected to the external first voltage Vcc source configuring the memory device as a x4 static column decode DRAM with write per bit.

4. The electronic device of claim 2 wherein the first and third programming bond pads are connected to the external second voltage Vss source and the second programming bond pad is connected to the external first voltage Vcc source configuring the memory device as a x1 Nibble Mode DRAM.

5. The electronic device of claim 2 wherein the first programming bond pad is connected to the external second voltage Vss source and the second and third programming bond pads are connected to the external first voltage Vcc source configuring the memory device as a x4 Enhanced Page Mode DRAM with Write Per Bit.

6. The electronic device of claim 2 wherein the first programming bond pad is connected to the external first voltage Vcc source and the second and third programming bond pads are connected to the external second voltage Vss source configuring the memory device as a x1 static column decode mode DRAM.

7. The electronic device of claim 2 wherein the first and third programming bond pads are connected to the external first voltage Vcc source and the second programming bond pad is connected to the external second voltage Vss source configuring the memory device as a x4 static column decode mode DRAM.

8. The electronic device of claim 2 wherein the first and third programming bond pads are connected to the external first voltage Vcc source and the third programming bond pad is connected to the external second voltage Vss source configuring the memory device as a x1 Enhanced Page Mode DRAM.

9. The electronic device of claim 2 wherein the first, second and third programming bond pads are connected to the external first voltage Vcc source configuring the memory device as a x4 Enhanced Page Mode DRAM.

10. The electronic device of claim 2 wherein said mode circuitry includes an inverter sensing the voltage on each of said programming lead pins.

11. A dynamic random access memory having selectable programmable features comprising:
an integrated circuit carrying plural programming bond pads each being connected to a respective programming lead pin, said programming lead pins selectably being connected to an external first reference voltage Vcc or to an external second reference voltage Vss; and
programming option circuitry connected to said plural programming bond pads and sensing the voltage on each said programming lead pin, said option circuitry producing at least one output signal of one state in response to a respective programming lead pin being sensed to be connected to said external first reference voltage Vcc and of another state in response to said respective programming lead pin being sensed to be connected to said external second reference voltage Vss.

12. A method for providing option programming control to a semiconductor device, the method comprising the steps of:
coupling a programming lead pin to an external first voltga Vcc to operate the device in a first mode;
coupling the programming pin to an external second voltage Vss to operate the device in a second mode;
providing additional programming lead pins; and
sensing the voltage on each programming lead pin to produce at least one output signal of one state in response to a respective programming lead pin being sensed to be connected to said external first voltage Vcc and of another state in response to said respective programming lead pin being sensed to be connected to said external second voltage Vss.

* * * * *